United States Patent [19]
Shimizu

[11] Patent Number: 5,983,389
[45] Date of Patent: Nov. 9, 1999

[54] ERROR CORRECTION DECODING APPARATUS

[75] Inventor: Tetsuya Shimizu, Yokohama, Japan

[73] Assignee: Canon Kabushiki Kaisha, Tokyo, Japan

[21] Appl. No.: 08/943,026

[22] Filed: Oct. 2, 1997

[30] Foreign Application Priority Data

Oct. 8, 1996 [JP] Japan .................................. 8-267117

[51] Int. Cl.$^6$ ................................................ H03M 13/00
[52] U.S. Cl. .......................................... 714/781; 714/784
[58] Field of Search ................... 714/781, 782, 714/784, 755, 756

[56] References Cited

U.S. PATENT DOCUMENTS

| | | | |
|---|---|---|---|
| 4,567,594 | 1/1986 | Deodhar | 371/38 |
| 4,841,300 | 6/1989 | Yoshida et al. | 341/94 |
| 4,899,341 | 2/1990 | Tomimitsu | 371/37.5 |
| 5,170,399 | 12/1992 | Cameron et al. | 371/37.1 |
| 5,212,695 | 5/1993 | Shikakura et al. | 371/37.1 |
| 5,315,600 | 5/1994 | Iwamura et al. | 371/37.6 |
| 5,325,373 | 6/1994 | Iwamura et al. | 371/37.1 |
| 5,490,154 | 2/1996 | Mester | 371/37.1 |
| 5,689,727 | 11/1997 | Bonke et al. | 395/840 |
| 5,712,861 | 1/1998 | Inoue et al. | 371/37.1 |

*Primary Examiner*—Stephen M. Baker
*Attorney, Agent, or Firm*—Fitzpatrick, Cella, Harper & Scinto

[57] ABSTRACT

There is provided an error correction decoding apparatus including a first operating unit including a Galois field polynomial operation circuit for obtaining a Galois field polynomial, a second operating unit including a Galois field operation circuit for performing an operation by using the Galois field polynomial, and a program generating unit for generating a control program for the first and second operating units, wherein the first and second operating unit are provided in parallel with each other.

Also, there is provided an error correction decoding apparatus including a first operating unit including a Galois field polynomial operation circuit for obtaining a Galois field polynomial and a register circuit used when the Galois field polynomial operation circuit performs an operation, a second operating unit including a Galois field operation circuit for performing an operation by using the Galois field polynomial and a general-purpose operation circuit, a register unit used when the first and second operating unit perform operations, and a program generating unit for generating a control program for the first and second operating unit, wherein the first and second operating units and the register unit are provided in parallel with each other.

6 Claims, 6 Drawing Sheets

ERROR CORRECTION DECODING APPARATUS

BACKGROUND OF THE INVENTION

1. Field of the Invention

The present invention relates to an error correction decoding apparatus for correcting a code error in transmitted code data.

2. Related Background Art

Recently, the density of digital recording has increased steadily, and an error correction encoding/decoding apparatus which can operate at a high speed and has high correction performance is in demand accordingly.

A Reed-Solomon code is a kind of a BCH code and has high correction performance because it can be corrected in units of bytes. Accordingly, a Reed-Solomon code is extensively used in a variety of fields such as an optical disk and a digital VTR.

The principle of a representative decoding method for a Reed-Solomon code will be briefly described below.

A q-element Reed-Solomon code having $\alpha$ as a primitive element of GF(q) and 1, $\alpha$, $\alpha^2$, ..., $\alpha^{d-2}$ as a root of a generator polynomial G(x) will be taken as an example. Code length n=q-1, information symbol number k=q-d, and minimum distance $d_{min}$=d.

First, a syndrome Si is calculated from a received polynomial Y(x) from equation (1) below.

$$S_i = Y(\alpha^i) = E(\alpha^i)(i=0, 1, \ldots, d-2) \quad (1)$$

where E(x) is a polynomial representing an error pattern.

Assume that one error occurs in a position $j_1, j_2, \ldots, j_1$. Note that $$n-1 \geq j_1 > j_2 > \ldots > j_1 \geq 0 \quad (2)$$

$$1 \leq t = \lceil (d-1)/2 \rfloor \quad (3)$$

where $\lceil x \rfloor$ is a maximum integer smaller than x and t indicates the error correction performance.

If this is the case, an error pattern polynomial E(x) is represented by $$E(x) = E_1 x^{j_1} + E_2 x^{j_2} + \ldots + E_1 x^{j_1} \quad (4)$$

$E_i$ (i=1, ..., 1) is the value of an error in a position $j_i$ and the element of GF(q). The syndrome $S_i$ is rewritten from equation (1) as follows.

$$S_i = E_1 x^i_1 + E_2 x^i_2 + \ldots + E_1 x^i_1 \quad (5)$$

$$\text{for } x_i = \alpha^{ji} (i=1, \ldots, 1) \quad (6)$$

A Reed-Solomon code is decoded by calculating the error positions $j_1, j_2, \ldots, j_1$ and the error values $E_1, E_2, \ldots, E_1$ from the syndrome $S_i$. For this purpose, two polynomials $$\sigma(z) = \sigma_1 z^1 + \ldots + \sigma_1 z + \sigma_0 \quad (7)$$
$$= (1-x_1 z)(1-x_2 z)\ldots(1-x_1 z)$$

$$\eta(z) = \eta_{l-1} z^{l-1} + \ldots + \eta_1 z + \eta_0 \quad (8)$$
$$= \sum_{i=1}^{l} E_i \prod_{k \neq i}(1-x_k z)$$

on GF(q) are calculated. These polynomials have $\alpha^{-j_1}, \alpha^{-j_2}, \ldots, \alpha^{-j_1}$ as a root. $\sigma(z)$ is called an error position polynomial, and $\eta(z)$ is a polynomial required to calculate the error value and is called an error evaluation polynomial.

Consider the following polynomial having the syndrome as a coefficient.

$$S(z) = S_{d-2} z^{d-2} + \ldots + S_1 z + S_0 \quad (9)$$

The relationship between the syndrome polynomial, $\sigma(z)$, and $\eta(z)$ can be written as follows.

$$\sigma(z) S(z) \equiv \eta(z) \bmod z^{d-1} \quad (10)$$

This is a fundamental equation from which $\sigma(z)$ and $\eta(z)$ can be calculated.

When the error correction performance t is 4 to 5, a method based on a Euclidean method of mutual division can be used as a method of efficiently calculating $\sigma(z)$ and $\eta(z)$. This method will be referred to as a Euclidean algorithm hereinafter. Equation (10) can be rewritten as follows by using an appropriate polynomial A(z).

$$A(z) z^{d-1} + \sigma(z) S(z) = \eta(z) \quad (11)$$

Since it is assumed that the error number 1 is t or less, the following equation must hold.

$$\deg \eta(z) < \deg \sigma(z) \leq t \quad (12)$$

where deg is the degree of a polynomial.

As is apparent from equations (8) and (7), $\sigma(z)$ and $\eta(z)$ have no common factor. It is proved that $\sigma(z)$ and $\eta(z)$ that satisfy equation (12) can be uniquely determined. Also, it is known that such $\sigma(z)$ and $\eta(z)$ can be calculated by the Euclidean algorithm for calculating the greatest common divisor polynomial of $z^{d-1}$ and S(z). FIG. 1 shows a general method of the Euclidean algorithm.

As a method of obtaining the root of $\sigma(z)$ calculated by the Euclidean algorithm, chien search is generally used. Chien search is a method by which power $\alpha^i$ (i=0, 1, ..., n-1) of $\alpha$ is sequentially substituted into $\sigma(z)$ and whether $\sigma(\alpha^i)$ equals 0 is checked.

Error values $e_1, e_2, \ldots, e_1$ can be calculated as follows.

$$e_i = -\eta(\alpha^{-ji})/\sigma(\alpha^{-ji})'(i=1, \ldots, 1) \quad (13)$$

where $\sigma(z)'$ is a derived function of $\sigma(z)$ an calculated by formally differentiating $\sigma(z)$.

Conventionally, the individual steps of the above correction processing are generally pipelined and constituted by hardware.

FIG. 2 shows an example of the arrangement of a conventional Reed-Solomon code error correction decoding apparatus. Referring to FIG. 2, input data containing an error correction encoded error from an input terminal 600 is delayed by a processing time (to be described below) by a data delay circuit 601. At the same time, a syndrome operation circuit 602 calculates the syndrome $S_i$ in accordance with equation (1). This syndrome $S_i$ is supplied as the syndrome polynomial represented by equation (2) to a Galois field polynomial operation circuit 603.

The Galois field polynomial operation circuit 603 calculates the error position polynomial $\sigma(z)$ and the error value polynomial $\eta(z)$ by using the Euclidean algorithm shown in FIG. 1. In this Euclidean algorithm, primarily a quotient polynomial and a remainder polynomial of a Galois field polynomial are repeatedly calculated. The error position polynomial $\sigma(z)$ satisfying a comparison condition of degR (z)<t−1 in the Galois field polynomial operation circuit 603 is supplied to a chien search circuit 604.

The chien search circuit 604 sequentially substitutes elements of a Galois field GF($2^m$) and checks whether each resultant value equals 0, thereby calculating a root. The chien search circuit 604 then supplies error position information i, the error value $\eta(z)$, and the value $\sigma(z)'$ calculated by formally differentiating the error position to an error value calculation circuit 605. The error value calculation circuit 605 calculates the error value $e_i$ from the error position information i calculated by the chien search circuit 604 and equation (13).

The error position and value thus calculated are supplied to a correction circuit 606. The correction circuit 606 performs correction processing by calculating exclusive OR of the error position in the data sequence delayed by the data delay circuit 601 and the calculated error value. The correction circuit 606 outputs the result from an output terminal 607.

In the above conventional arrangement, however, although high-speed processing is accomplished by constituting all blocks by hardware, the circuit scale inevitably increases. Additionally, the hardware configuration of the control block must be changed whenever the algorithm is altered for, e.g., complicated repetitive decoding including erasure correction of product-modulated data.

SUMMARY OF THE INVENTION

Under the circumstances as described above, it is an object of the present invention to provide an error correction decoding apparatus which can perform high-speed processing with a small circuit scale and has high versatility, and a method for the apparatus.

To achieve the above object, according to one preferred embodiment of the present invention, there is provided an error correction decoding apparatus comprising first operating means including a Galois field polynomial operation circuit for obtaining a Galois field polynomial, second operating means including a Galois field operation circuit for performing an operation by using the Galois field polynomial, and program generating means for generating a control program for the first and second operating means, wherein the first and second operating means are provided in parallel with each other.

Also, according to another preferred embodiment of the present invention, there is provided an error correction decoding apparatus comprising first operating means including a Galois field polynomial operation circuit for obtaining a Galois field polynomial and a register circuit used when the Galois field polynomial operation circuit performs an operation, second operating means including a Galois field operation circuit for performing an operation by using the Galois field polynomial and a general-purpose operation circuit, register means used when the first and second operating means perform operations, and program generating means for generating a control program for the first and second operating means, wherein the first and second operating means and the register means are provided in parallel with each other.

Other objects, features and advantages of the invention will become apparatus from the following detailed description taken in conjunction with the accompanying drawings.

DETAILED DESCRIPTION OF THE PREFERRED EMBODIMENT

An embodiment of the present invention will be described in detail below with reference to the accompanying drawings.

Figure 1:
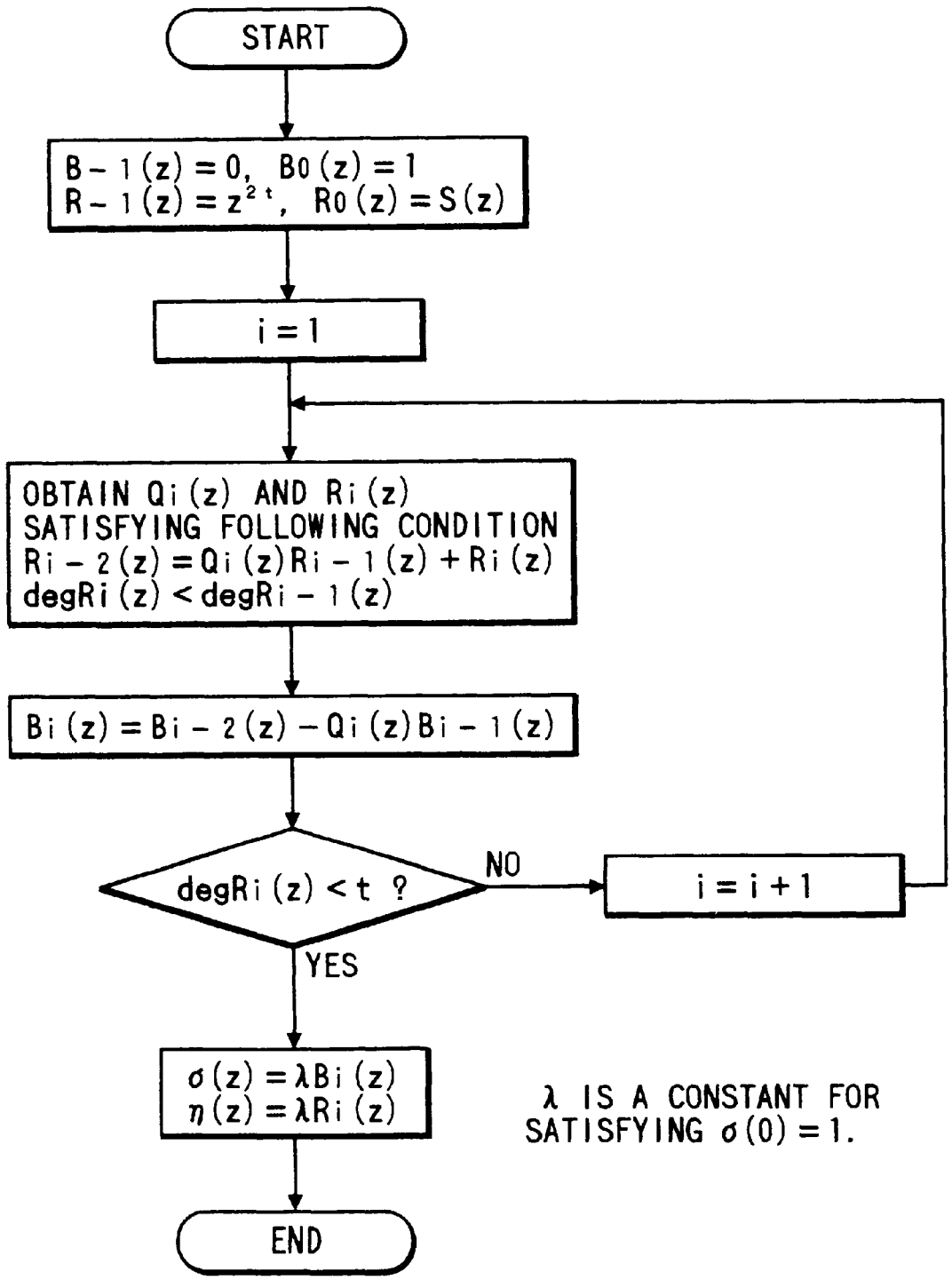
FIG. 1 is a flow chart of a general Euclidean algorithm.
Figure 2:
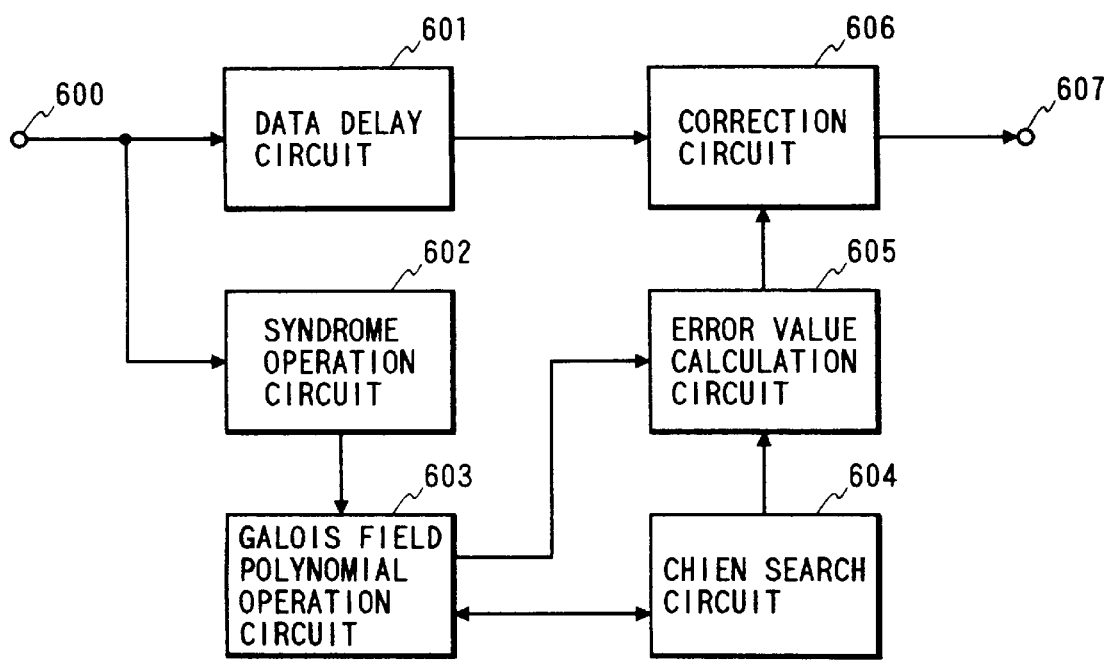
FIG. 2 is a block diagram showing the arrangement of a conventional error correction decoding apparatus.
Figure 3:
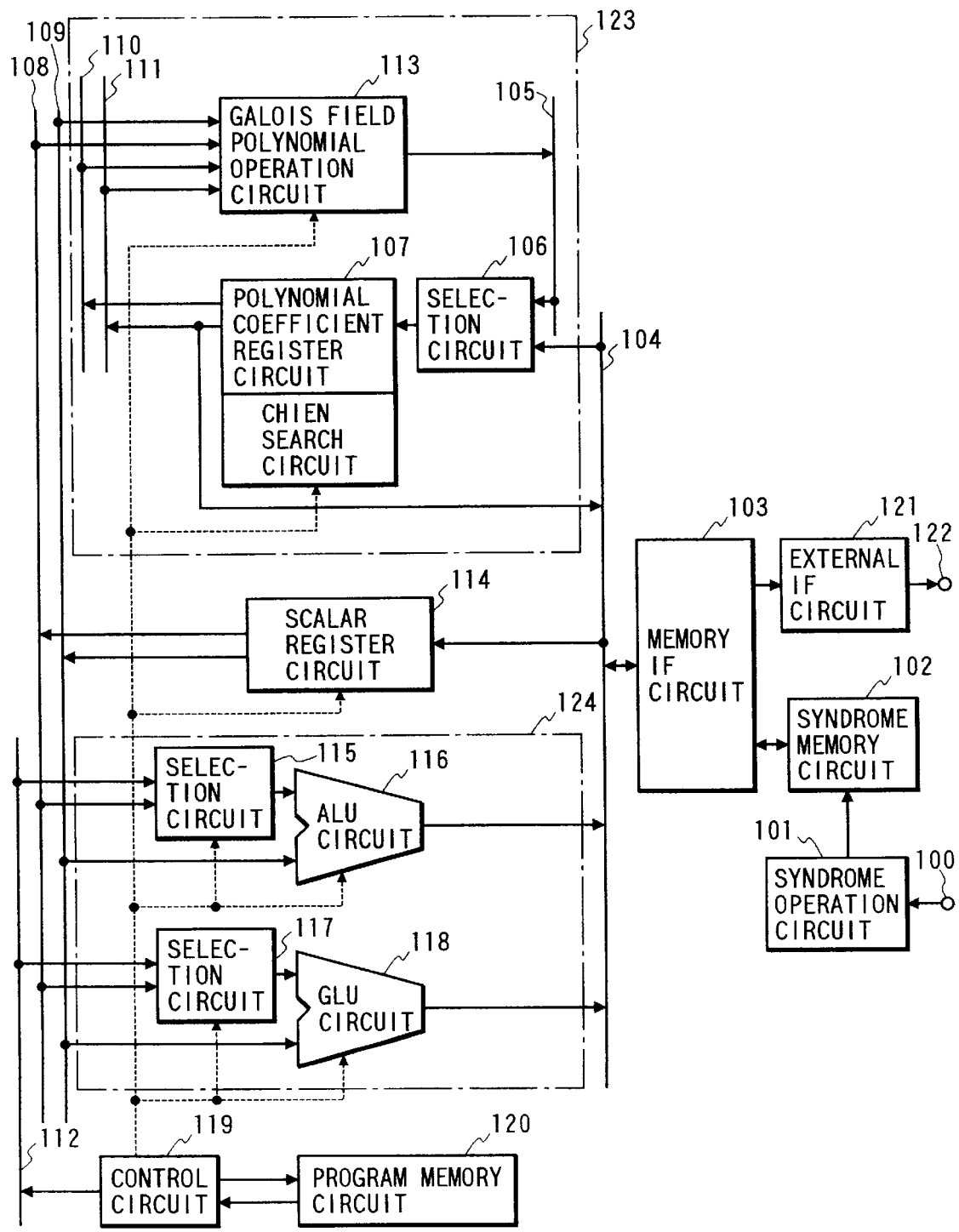
FIG. 3 is a block diagram showing an embodiment of an error correction decoding apparatus according to the present invention.

FIG. 3 is a block diagram showing an embodiment of an error correction decoding apparatus of the present invention.

Referring to FIG. 3, a polynomial unit (first operating means) 123 which is the most characteristic feature in this embodiment comprises a Galois field polynomial operation circuit 113 and a polynomial coefficient register circuit 107 including a chien search circuit. This polynomial unit 123 is connected to a data bus in parallel with a scalar operation circuit (second operating means) 124 which comprises a scalar register circuit (register means) 114, a general-purpose operation circuit (ALU circuit) 116, and a Galois field operation circuit (GLU circuit) 118.

That is, the polynomial unit 123 is connected to output buses (an A bus 108 and a B bus 109) of the scalar register circuit 114 as input of coefficient data and to an input bus (F bus) 104 of the scalar register circuit 114 as input/output of polynomial data. Assume that a Galois field GF($2^8$) is used and each data bus is an 8-bit bus.

As described above, the scalar register circuit 114 is a 3-port memory to which the A bus 108, the B bus 109, and the F bus 104 are connected, and which can perform one write and two reads independently of each other.

Also, the ALU circuit 116 and the GLU circuit 118 in the scalar operation circuit 124 can perform operations using input immediates from an immediate bus (I bus) 112 in addition to output values from the scalar register circuit 114. That is, selection circuits 115 and 117 select one of the A bus 108 and the I bus 112, an operation is performed for the selected value and the value of the B bus 109, and the operation result is output to the F bus 104.

Consequently, this operation result is written in the scalar register 114, in the polynomial coefficient register circuit 107 via a selection circuit 106, or in a syndrome memory circuit 102 via a memory IF circuit 103, or output to an external device (e.g., a correction circuit) via an external IF circuit 121.

An operation will be described below by taking C1 syndrome decoding for C1(80, 72) and C2(90, 82) Reed-Solomon codes as an example.

Input data from an input terminal 100 is input in units of encoding blocks (80×90 bytes). A syndrome operation circuit 101 constituted by a Galois field addition circuit and a Galois field coefficient circuit calculates a C1 syndrome and a C2 syndrome in parallel with each other, and writes the calculation results in the syndrome memory 102.

The syndrome memory 102 has a capacity capable of storing syndromes of two blocks. At the same time syndromes of one block are written, a processor (constituted by, e.g., the polynomial unit 123, the scalar register 114, and the scalar operation circuit 124 described above) reads out syndromes written in the immediately preceding block via the memory IF circuit 103. In this manner error correction decoding processing can be performed.

The processor performs the error correction processing in accordance with an instruction code read out from a program memory circuit 120 by a control circuit 119. This instruction code includes a scalar instruction and a vector instruction. Polynomial memory access and operations of polynomials can be performed by one vector instruction. By changing the program to be supplied to the processor, the error correction algorithm can be altered without changing any hardware.

In the error correction decoding processing performed by the processor, an error position polynomial and an error value polynomial are first calculated from a syndrome polynomial by a Euclidean algorithm. That is, the C1 syndrome written in the syndrome memory circuit 102 is transferred as a 7-degree syndrome polynomial to the polynomial coefficient register circuit 107 by the vector instruction. On the basis of a Euclidean algorithm shown in FIG. 4, the Galois field polynomial operation circuit 113 and the polynomial coefficient register circuit 107 perform operations for obtaining the error position polynomial and the error value polynomial.

Figure 4:
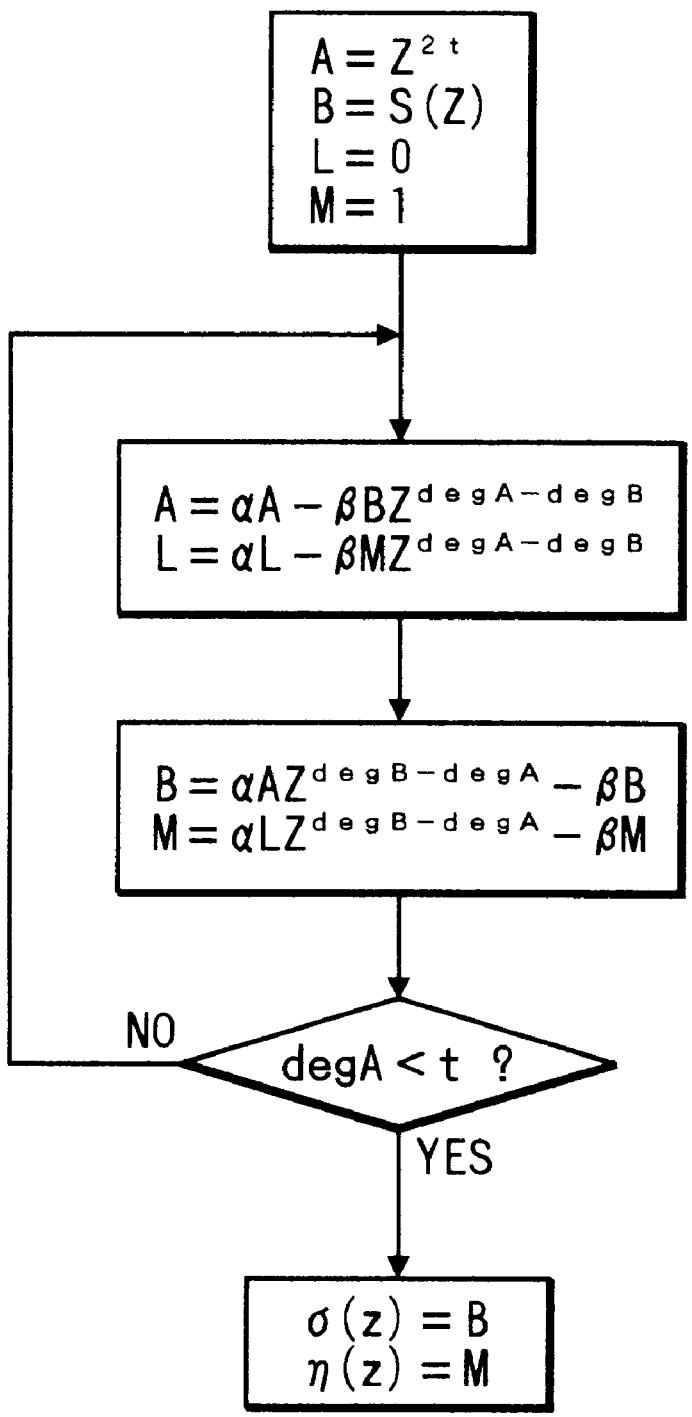
FIG. 4 is a flow chart of a Euclidean algorithm used in this embodiment.

Referring to FIG. 4, A, B, L, and M are Galois field polynomials, $\alpha$ and $\beta$ are the coefficients of the highest degrees of the Galois field polynomials A and B, t is error correction performance, S(Z) is a syndrome polynomial, $\sigma(Z)$ is an error position polynomial, and $\eta(Z)$ is an error value polynomial.

Figure 5:
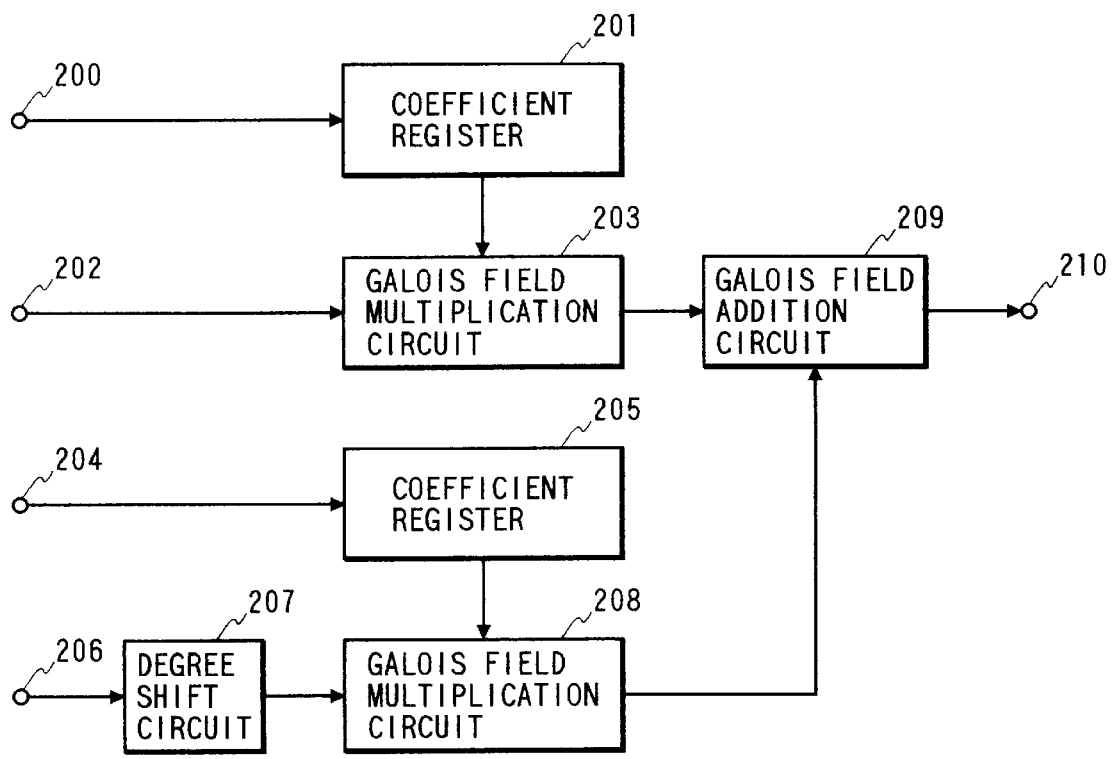
FIG. 5 is a block diagram showing a practical configuration of a Galois field polynomial operation circuit in FIG. 3.

FIG. 5 is a detailed block diagram of the Galois field polynomial operation circuit 113. In the configuration shown in FIG. 5, operations of the following expressions used in the Euclidean algorithm shown in FIG. 4 can be performed by a single instruction. In expressions (14) and (15) below, a and $\beta$ are Galois field elements, and X(Z) and Y(Z) are Galois field polynomials.

$$\alpha X(Z) + \beta Y(Z) \quad (14)$$

$$\alpha X(Z) + \beta Y(Z) Z \quad (15)$$

For example, when a vector instruction corresponding to expression (14) is issued, the coefficients of $\alpha$ and $\beta$ are input from input terminals 200 and 204 connected to the A bus 108 and the B bus 109 in FIG. 3, and are set in coefficient registers 201 and 205, respectively. Also, the Galois field polynomials X(Z) and Y(Z) are input from input terminals 202 and 206 connected to output buses (a PA bus 110 and a PB bus 111, respectively) of the polynomial coefficient register 107.

Galois field multiplication circuits 203 and 208 multiply the input Galois field polynomials X(Z) and Y(Z) by the coefficients $\alpha$ and $\beta$ set in the coefficient registers 201 and 205, respectively. The respective products are added by a Galois field addition circuit 209 and supplied to an output terminal 210.

On the other hand, when a vector instruction corresponding to expression (15) is issued, the degree of the input polynomial Y(Z) from the input terminal 206 is shifted by one degree by a degree shift circuit 207. Thereafter, the same operation as for the vector instruction corresponding to expression (14) is performed, and the operation result is supplied to the output terminal 210. The output data from the output terminal 210 is written in the polynomial coefficient register 107 via a bus 105 and the selection circuit 106 in FIG. 3.

In the above Euclidean algorithm, the processing steps such as the comparison of degrees and the generation of register addresses other than the polynomial operations are performed in parallel with the polynomial operations by using the scalar register circuit 114 and the scalar operation circuit 124.

When the processing using the Euclidean algorithm shown in FIG. 4 is complete, the obtained error position polynomial $\sigma(Z)$ and error value polynomial $\eta(Z)$ are written in specific addresses of the polynomial coefficient register circuit 107, and the chien search circuit calculates the root.

Figure 6:
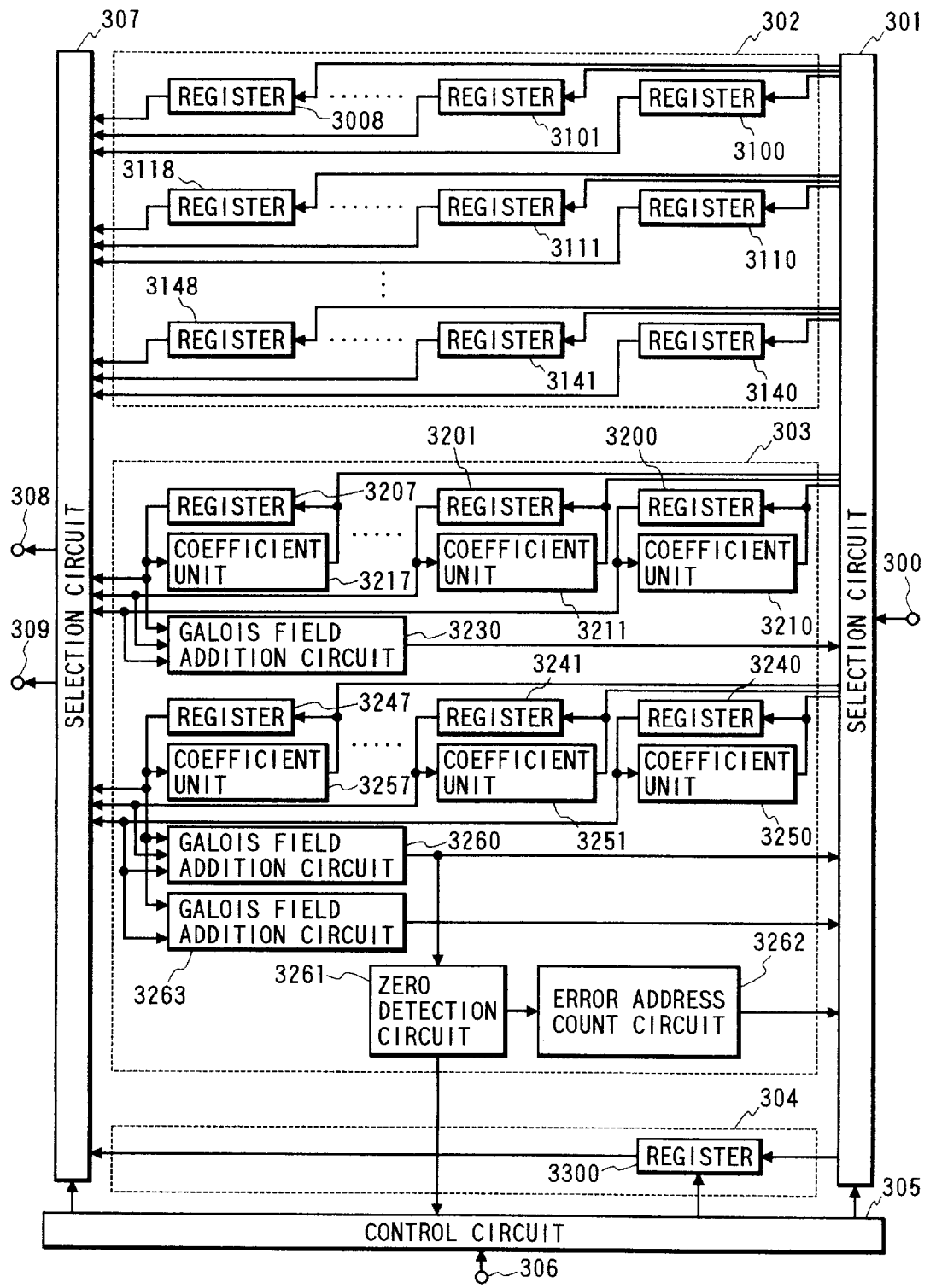
FIG. 6 is a block diagram showing a practical configuration of a polynomial coefficient register in FIG. 3.

FIG. 6 is a detailed block diagram of the polynomial coefficient register circuit 107. This polynomial coefficient register circuit 107 is a 3-port memory similar to the scalar register circuit 114 and can independently perform one write from an input terminal 300 via a section circuit 301 and two reads for output terminals 308 and 309 via a selection circuit 307.

Addresses for selecting registers in the polynomial coefficient register 107 include an upper address for selecting a vector and a lower address for selecting a coefficient in the vector. These addresses are input from an input terminal 306 to a control circuit 305. The control circuit 305 decodes the input addresses and selects write and read registers by controlling the selection circuits 301 and 307.

As an example, assume that input addresses shown below are used to select one of a general-purpose register circuit 302, a chien search register circuit 303, and a control register circuit 304 and select internal registers of the circuit.

| Upper addresses | Lower addresses | |
|---|---|---|
| 0–4 | 0–8 | General-purpose register |
| 5–6 | 0–7 | Chien search register |
| 7 | 0 | Control register |

The highest degree of the polynomial used in the error correction processing is $Z^8$. Accordingly, in the general-purpose register circuit 302, registers for five vectors, assuming that a nine-byte coefficient forms one vector, i.e., 9×5 byte-registers 3100 to 3148, can be randomly accessed. In this configuration, the registers 3100 to 3118 in upper addresses 0 and 1 are assigned as registers used in polynomial operations done by the Euclidean algorithm. The registers 3120 to 3148 in upper addresses 2 to 4 are assigned as registers for storing the results of chien search.

Also, in the chien search circuit 303, 8×2 byte-registers 3200 to 3207 and 3240 to 3247 are accessible at random. These registers are connected to coefficient units 3210 to 3217 and 3250 to 3257 for multiplying Galois field coefficients $\alpha^{254}$ to $\alpha^{247}$.

Outputs from the Galois field coefficient units 3210 to 3217 are applied to a Galois field addition circuit 3230 where Galois field addition is performed for all of the coefficients. The sum can be written in another register via the selection circuit 301. Also, outputs from the Galois field coefficient units 3250 to 3257 are applied to a Galois field addition circuit 3260 where Galois field addition is performed for all of the coefficients, and the sum is output to the selection circuit 301. Furthermore, even-degree outputs from the Galois field coefficient units 3250 to 3257 are applied to a Galois field addition circuit 3263 where Galois field addition is performed for these even-degree coefficients, and the sum is output to the selection circuit 301.

The output from the Galois field addition circuit 3260 is also supplied to a zero detection circuit 3261. The zero detection circuit 3261 checks whether the output value from the Galois field addition circuit 3260 is "0". If the output value is "0", the zero detection circuit 3261 supplies a control signal to the control circuit 305 and an error address count circuit 3262. In accordance with the control signal from the zero detection circuit 3261, the error address count circuit 3262 outputs an error address to the selection circuit 301.

The operation of the polynomial coefficient register circuit 107 having the configuration as shown in FIG. 6 will be described below. First, the error value polynomial $\eta(Z)$ and the error position polynomial $\sigma(Z)$ calculated by the Galois field polynomial operation circuit 113 in FIG. 3 by using the Euclidean algorithm in FIG. 4 are written in the chien search registers 3200 to 3207 and 3240 to 3247 at upper addresses 5 and 6, respectively. After the error position polynomial $\sigma(Z)$ and the error value polynomial $\eta(Z)$ are thus set in these registers, a control register 3300 in the upper address 7 is selected to set a code length (80 herein). At the same time, a flag of chien search start is set.

When the chien search start flag is set, the control circuit 305 opens the I/O terminals of the chien search registers 3200 to 3207 and 3240 to 3247 by controlling the selection circuits 301 and 307, and controls these registers to sequentially substitute the powers of $\alpha$ into the error value polynomial $\eta(Z)$ and the error position polynomial $\sigma(Z)$ until the code length is reached. Simultaneously, the control circuit 305 applies the output from the Galois field addition circuit 3260 to the zero detection circuit 3261 which checks whether $\sigma(\alpha^i)=0$.

If the zero detection circuit 3261 detects that $\sigma(\alpha^i)=0$, the control circuit 305 writes the output from the Galois field addition circuit 3260 as $\eta(\alpha^i)$ in the register at upper address 2, the output from the Galois field addition circuit 3263 as a formal derivative $\sigma'(\alpha^i)$ of $\sigma(\alpha^i)$ in the register at upper address 3, and the output from the error address counter 3262 as an error address i in the register at upper address 4, via the selection circuit 301.

Thereafter, the chien search is complete when the powers of $\alpha$ are substituted 80 times as the code length. When the chien search is complete, the control circuit 305 writes a chien search end flag in the control register 3300. The end of the chien search can be known by reading out the flag from the control register 3300 by the program.

While the chien search circuit in the polynomial coefficient register circuit 107 is performing the chien search processing, the Galois field polynomial operation circuit 113 can simultaneously execute the Euclidean algorithm for the next code by using the registers at upper addresses 0 and 1; it is unnecessary to stop the processing to perform chien search. Accordingly, the error correction processing can be performed at a high speed.

Also, when the chien search processing is complete, an error value $e_i$ can be calculated by operating equation (16) below by using the GLU circuit 118 in the scalar operation circuit 124.

$$e_i = \frac{\eta(\alpha_i)}{\sigma'(\alpha^i)} \quad (16)$$

The error address i calculated by the chien search circuit in the polynomial coefficient register circuit 107 and the error value $e^i$ calculated by the GLU circuit 118 are supplied to a correction circuit (not shown) from an output terminal 122 via the memory IF circuit 103 and the external IF circuit 121, and error correction is performed. Additionally, the C2 syndrome in the syndrome circuit 102 is rewritten. C1 correction processing can be executed at a high speed by repeating the above procedure.

Erasure correction can be realized by performing error correction processing by assuming that the error position is already found. Encoding processing is also accomplished by performing erasure correction for the parity position.

As has been described above, the error correction decoding apparatus of this embodiment has a processor configuration in which first and second operating means are provided in parallel with each other and controlled in accordance with programs generated by a program generating means. Therefore, all changes in algorithms for performing error correction can be realized by software, so a high-versatility system can be realized with a small circuit scale. Additionally, while a Galois field operation circuit in the second operating means is performing an operation, a Galois field polynomial operation circuit in the first operating means provided in parallel with the second operating means can calculate a Galois field polynomial for the next coded data. Accordingly, the processing speed can be increased.

Furthermore, Galois field coefficient units and Galois field addition circuits are added to some of registers constituting a register circuit, and roots are calculated by chien search for Galois field polynomials written in these registers. Since a chien search function is thus given to a portion of the register circuit, operations of Galois field polynomials done by a Galois field polynomial operation circuit and calculations of error positions by chien search can be executed in parallel with each other by controlling programs. This further increases the processing efficiency and realizes error correction processing at a higher speed.

In other words, the foregoing description of embodiments has been given for illustrative purposes only and not to be constructed as imposing any limitation in every respect.

The scope of the invention is, therefore, to be determined solely by the following claims and not limited by the text of the specifications and alterations made within a scope equivalent to the scope of the claims fall within the true spirit and scope of the invention.

What is claimed is:

1. An error correction decoding apparatus comprising:
   a) first operating means comprising a Galois field polynomial operation circuit for obtaining a Galois field polynomial;
   b) second operating means comprising a Galois field operation circuit for performing an operation by using the Galois field polynomial,
   said first and second operating means being provided in parallel with each other; and
   c) program generating means for generating a control program for said first and second operating means.

2. An apparatus according to claim 1, wherein said first operating means comprises a chien search circuit for obtaining an error position of an error correction coded data by calculating a root of the Galois field polynomial by chien search.

3. An apparatus according to claim 1, wherein said Galois field polynomial operation circuit comprises multiplying means and adding means for multiplying a plurality of given Galois field polynomials by a coefficient and adding products, and performs an operation defined by expressions below:

$$\alpha X(Z) + \beta Y(Z)$$

$$\alpha X(Z) + \beta Y(Z) Z$$

where $\alpha$ and $\beta$ are Galois field elements and $X(Z)$ and $Y(Z)$ are Galois field polynomials.

4. An error correction decoding apparatus comprising:
a) first operating means comprising a Galois field polynomial operation circuit for obtaining a Galois field polynomial and a register circuit used when said Galois field polynomial operation circuit performs an operation;
b) second operating means comprising a Galois field operation circuit for performing an operation by using the Galois field polynomial and a general-purpose operation circuit;
c) register means used when said first and second operating means perform operations,
said first and second operating means and said register means being provided in parallel with each other; and
d) program generating means for generating a control program for said first and second operating means.

5. An apparatus according to claim 4, wherein said register circuit comprises a register used when said Galois field polynomial operation circuit obtains the Galois field polynomial, and a register for storing the obtained Galois field polynomial, and a Galois coefficient unit and a Galois field addition circuit are coupled to said register for storing the Galois field polynomial to obtain an error position of error correction coded data by calculating a root by chien search for the Galois field polynomial written in said register.

6. An apparatus according to claim 4, wherein said Galois field polynomial operation circuit comprises multiplying means and adding means for multiplying a plurality of given Galois field polynomials by a coefficient and adding products, and performs an operation defined by expressions below:

$$\alpha X(Z) + \beta Y(Z)$$

$$\alpha X(Z) + \beta Y(Z) Z$$

where $\alpha$ and $\beta$ are Galois field elements and $X(Z)$ and $Y(Z)$ are Galois field polynomials.

* * * * *

UNITED STATES PATENT AND TRADEMARK OFFICE
CERTIFICATE OF CORRECTION

PATENT NO. : 5,983,389
DATED : November 9, 1999
INVENTOR(S) : TETSUYA SHIMIZU

It is certified that error appears in the above-identified patent and that said Letters Patent is hereby corrected as shown below:

[57] ABSTRACT

Line 8, "unit" should read --units--.
Line 18, "unit" (second occurrence) should read ---units--.
Line 20, "unit," should read --units,--.

COLUMN 1

Line 27, "Si" should read --$S_i$--.

COLUMN 2

Line 20, "$A(z)z^{d-}$" should read --$A(z)z^{d-1}$--.
Line 33, "$z^{d-}$" should read --$z^{d-1}$--.
Line 44, "an" should read --and--.
Line 65-66, "degR (z)<t-1" should read --$degR(z) \leq t-1$--.

COLUMN 3

Line 58, "apparatus" should read --apparent--.

UNITED STATES PATENT AND TRADEMARK OFFICE
CERTIFICATE OF CORRECTION

PATENT NO. : 5,983,389
DATED : November 9, 1999
INVENTOR(S) : TETSUYA SHIMIZU

It is certified that error appears in the above-identified patent and that said Letters Patent is hereby corrected as shown below:

COLUMN 5

Line 31, "below, a" should read --below, $\propto$--.

COLUMN 7

Line 59, "value e$^i$" should read --value $e_i$--.

Signed and Sealed this

Third Day of April, 2001

*Attest:*

NICHOLAS P. GODICI

*Attesting Officer*  *Acting Director of the United States Patent and Trademark Office*